(12) United States Patent
Ivanov et al.

(10) Patent No.: US 12,057,992 B2
(45) Date of Patent: Aug. 6, 2024

(54) SYSTEMS AND METHODS FOR PROCESSING EXCESS EVENT MESSAGES USING A MOBILE APPLICATION

(71) Applicant: Tyco Fire & Security GmbH, Neuhausen am Rheinfall (CH)

(72) Inventors: Sergey Ivanov, Milwaukee, WI (US); Maxime Fortin, La Prairie (CA); Brahima Traore, Milwaukee, WI (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 0 days.

(21) Appl. No.: 17/709,017

(22) Filed: Mar. 30, 2022

(65) Prior Publication Data
US 2022/0318079 A1    Oct. 6, 2022

Related U.S. Application Data (60) Provisional application No. 63/168,004, filed on Mar. 30, 2021.

(51) Int. Cl.
*H04L 41/0604* (2022.01)
*G06F 9/54* (2006.01)
*H04L 41/0686* (2022.01)

(52) U.S. Cl.
CPC .......... *H04L 41/0622* (2013.01); *G06F 9/542* (2013.01); *G06F 9/546* (2013.01); *H04L 41/0686* (2013.01)

(58) Field of Classification Search
CPC . H04L 41/0622; H04L 41/0686; H04L 67/55; H04L 67/025; G06F 9/542; G06F 9/546
See application file for complete search history.

(56) References Cited

U.S. PATENT DOCUMENTS 7,903,903 B1    3/2011   Acker et al.
8,504,008 B1    8/2013   Gossweiler et al.
(Continued)

FOREIGN PATENT DOCUMENTS

WO    2018160181 A1    9/2018

OTHER PUBLICATIONS

International Search Report and Written Opinion in PCT/US2022/071451, mailed Jul. 27, 2022, 13 pages.
(Continued)

*Primary Examiner* — Tuan C Dao
(74) *Attorney, Agent, or Firm* — ARENTFOX SCHIFF LLP (57) ABSTRACT

Example implementations include a method, apparatus and computer-readable medium for processing excess event messages using a mobile application, comprising rendering, via the mobile application, a first view displaying first state information of a control panel configured to receive event information from one or more sensors in a physical location. The implementations further include controlling, data flow of a plurality of event messages generated by the control panel. Additionally, the implementations further include selecting one or more event messages of the plurality of event messages from the processing queue based on a dispatch timer and a dispatch threshold. Additionally, the implementations further include generating a second view based on processing of the one or more event messages and blocking processing of the processing queue. Additionally, the implementations further include rendering the second view displaying second state information of the control panel.

21 Claims, 6 Drawing Sheets

(56) References Cited

U.S. PATENT DOCUMENTS

| | | |
|---|---|---|
| 9,514,641 B2 | 12/2016 | Chen |
| 10,573,168 B1 | 2/2020 | Razak et al. |
| 10,665,070 B1 | 5/2020 | Picardi |
| 2003/0171969 A1 | 9/2003 | Morin et al. |
| 2003/0233485 A1* | 12/2003 | Khan ............. G06F 9/542 |
| | | 719/318 |
| 2005/0275876 A1* | 12/2005 | McLean ........... G06F 3/1204 |
| | | 358/1.15 |
| 2006/0092840 A1* | 5/2006 | Kwan ............. H04L 47/31 |
| | | 370/230.1 |
| 2006/0294045 A1* | 12/2006 | Suggs ............. G06F 9/5027 |
| 2007/0260777 A1* | 11/2007 | Timpe ............ G06F 13/4059 |
| | | 710/52 |
| 2009/0248967 A1 | 10/2009 | Sharma et al. |
| 2010/0332696 A1* | 12/2010 | Muppirala ........ G06F 13/1642 |
| | | 710/39 |
| 2012/0047435 A1 | 2/2012 | Holladay et al. |
| 2013/0147604 A1* | 6/2013 | Jones, Jr. .......... G08B 25/08 |
| | | 340/6.1 |
| 2013/0169817 A1* | 7/2013 | Jones ............. G08B 25/00 |
| | | 340/539.2 |
| 2014/0075446 A1* | 3/2014 | Wang ............. G06F 9/50 |
| | | 718/104 |
| 2014/0297393 A1 | 10/2014 | Phillipps |
| 2014/0354430 A1 | 12/2014 | Soldner et al. |
| 2015/0242455 A1 | 8/2015 | N. et al. |
| 2015/0254971 A1 | 9/2015 | Okeefe et al. |
| 2015/0348399 A1 | 12/2015 | Cree et al. |
| 2016/0117195 A1* | 4/2016 | Wang ............. G06F 9/5072 |
| | | 707/770 |
| 2016/0189491 A1* | 6/2016 | Sloo ............. G08C 23/04 |
| | | 345/173 |
| 2016/0294786 A1* | 10/2016 | Marquez Mendoza ............. |
| | | H04W 4/14 |
| 2017/0205987 A1 | 7/2017 | Martin et al. |
| 2017/0213447 A1 | 7/2017 | Horrocks et al. |
| 2017/0323020 A1 | 11/2017 | Bosarge et al. |
| 2018/0068114 A1 | 3/2018 | Matsuura et al. |
| 2019/0008248 A1* | 1/2019 | Kovtun ............. G05D 1/0088 |
| 2019/0096202 A1 | 3/2019 | Seelman |
| 2019/0190978 A1* | 6/2019 | Brown ............. B65G 43/10 |
| 2019/0250619 A1* | 8/2019 | Gillett ............. B62K 23/02 |
| 2019/0272736 A1 | 9/2019 | Trundle et al. |
| 2020/0019287 A1* | 1/2020 | Sahai ............. H04L 61/5092 |
| 2020/0302777 A1 | 9/2020 | Nalukurthy et al. |

OTHER PUBLICATIONS

Merriam-Webster's Collegiate Dictionary, vt. def. 3, 10th. ed., 1993, p. 1173.

The American Heritage Dictionary of the English Language, "Manage," 1992, 3rd edition, 3 pages.

* cited by examiner

502
Determining that the dispatch timer has expired;

504
Determining that the processing queue includes a number of events greater than or equal to the dispatch threshold 506
Dispatching the one or more event messages to an event processing component for the processing.

SYSTEMS AND METHODS FOR PROCESSING EXCESS EVENT MESSAGES USING A MOBILE APPLICATION

CLAIM OF PRIORITY

The present Application for Patent claims priority to U.S. Provisional Application No. 63/168,004 entitled "CLOUD-BASED FIRE PANEL APPLICATION" filed Mar. 30, 2021, and assigned to the assignee hereof and hereby expressly incorporated by reference.

TECHNICAL FIELD

Aspects of the present disclosure relate generally to cloud based event monitoring, and more particularly, to systems and methods for processing excess event messages using a mobile application.

BACKGROUND

Many event monitoring systems have employed cloud computing systems to gain the multitude of benefits provided by cloud computing. For example, some event monitoring system have gained scalability, reliability, performance, ease of deployment, and/or cost benefits by employing cloud services to collect event information from control panels located in a supervised premises and distribute the event information to remote user devices configured to monitor the status of the control panels. In some instances, monitoring personnel have configured mobile devices to monitor the status of the control panels via mobile applications. However, due to the limited capabilities (e.g., processing and memory limitations) of mobile devices, many mobile applications are unable to provide a satisfactory user experience when required to process large amounts of event messages, e.g., during an emergency when the status of a control panel is most critical.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

An example aspect includes a method for processing excess event messages using a mobile application, comprising rendering, via the mobile application, a first view displaying first state information of a control panel configured to receive event information from one or more sensors in a physical location, the mobile application subscribed to the control panel. The method further includes controlling, by an event spooler via a processing queue, data flow of a plurality of event messages generated by the control panel. Additionally, the method further includes selecting one or more event messages of the plurality of event messages from the processing queue based on a dispatch timer and a dispatch threshold. Additionally, the method further includes generating a second view based on processing of the one or more event messages and blocking processing of the processing queue. Additionally, the method further includes rendering, via the mobile application, the second view displaying second state information of the control panel.

Another example aspect includes an apparatus for processing excess event messages using a mobile application, comprising a memory and a processor communicatively coupled with the memory. The processor is configured to render, via the mobile application, a first view displaying first state information of a control panel configured to receive event information from one or more sensors in a physical location, the mobile application subscribed to the control panel. The processor is further configured to control, by an event spooler via a processing queue, data flow of a plurality of event messages generated by the control panel. Additionally, the processor further configured to select one or more event messages of the plurality of event messages from the processing queue based on a dispatch timer and a dispatch threshold. Additionally, the processor further configured to generate a second view based on processing of the one or more event messages and blocking processing of the processing queue. Additionally, the processor further configured to render, via the mobile application, the second view displaying second state information of the control panel.

Another example aspect includes an apparatus for processing excess event messages using a mobile application, comprising means for rendering a first view displaying first state information of a control panel configured to receive event information from one or more sensors in a physical location, the mobile application subscribed to the control panel. The apparatus further includes means for controlling data flow of a plurality of event messages generated by the control panel, an event spooler placing the plurality of event messages. Additionally, the apparatus further includes means for selecting one or more event messages of the plurality of event messages from a processing queue based on a dispatch timer and a dispatch threshold. Additionally, the apparatus further includes means for generating a second view based on processing of the one or more event messages and blocking processing of the processing queue. Additionally, the apparatus further includes means for rendering the second view displaying second state information of the control panel.

Another example aspect includes a non-transitory computer-readable medium storing instructions for processing excess event messages using a mobile application, wherein the instructions are executable by a processor to render, via the mobile application, a first view displaying first state information of a control panel configured to receive event information from one or more sensors in a physical location, the mobile application subscribed to the control panel. The instructions are further executable to control, by an event spooler via a processing queue, data flow of a plurality of event messages generated by the control panel. Additionally, the instructions are further executable to select one or more event messages of the plurality of event messages from the processing queue based on a dispatch timer and a dispatch threshold. Additionally, the instructions are further executable to generate a second view based on processing of the one or more event messages and blocking processing of the processing queue. Additionally, the instructions are further executable to render, via the mobile application, the second view displaying second state information of the control panel.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

This disclosure describes techniques for implementing a process for handling excess event messages using a mobile application. In particular, aspects of the present disclosure provide a client application configured to establish a balance between processing incoming event messages and updating a view displayed processed event messages within a graphical user interface. Accordingly, for example, a client application may subscribe to a control panel via a cloud computing platform, receive a load intense amount of event messages, and display current status information of the control panel by processing the event messages, thereby improving user experience and preventing application unresponsive.

Figure 1:
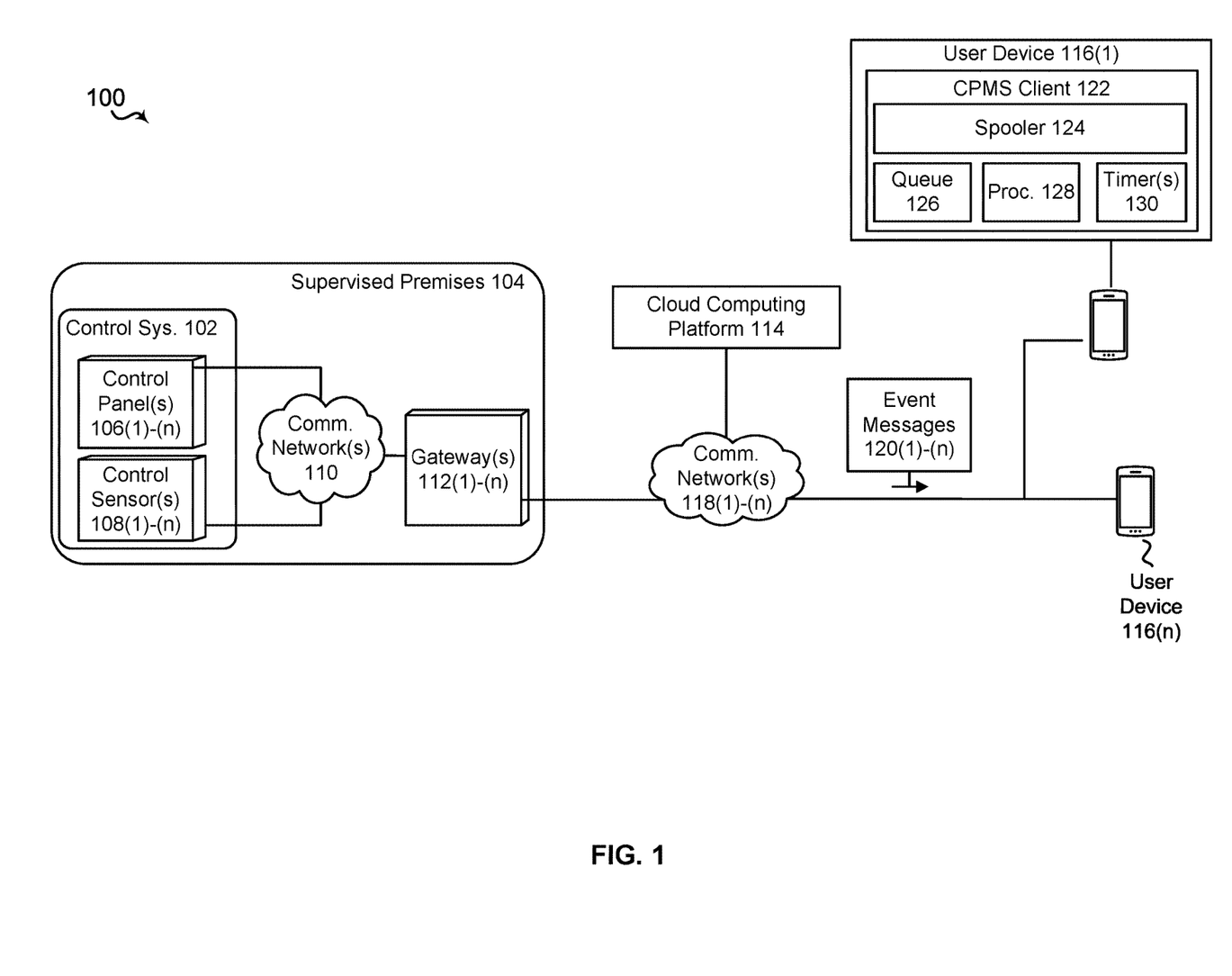
FIG. 1 is a diagram of an example of a cloud computing system for event monitoring, according to some implementations.

FIG. 1 is a diagram of an example of a control panel management system (CPMS) 100 for synchronizing an event monitoring application with an event monitoring service, according to some implementations. As illustrated in FIG. 1, a control panel management system (CPMS) 100 may include a control system 102 deployed within a supervised premises 104. Further, the control system 102 may include one or more control panels 106(1)-(n), one or more control sensors 108(1)-(n) deployed within the supervised premises 104, one or more communication networks 110(1)-(n), and one or more gateways 112(1)-(n). An example of a control sensor 108 may include a fire alarm and a corresponding example of a control panel 106 may include a fire panel configured to receive event information (e.g., smoke detected within a particular area of the supervised premises 104) from one or more fire alarms. Another example of a control sensor 108 may include a motion sensor and a corresponding example of a control panel is a security alarm panel configured to receive event information (e.g., motion detected within a particular area of the supervised premises) from one or more motion sensors. In some implementations, a communication network 110 may include a plain old telephone system (POTS), a radio network, a cellular network, an electrical power line communication system, one or more of a wired and/or wireless private network, personal area network, local area network, wide area network, and/or the Internet. Further, in some aspects, the control panels 106(1)-(n), the control sensors 108(1)-(n), and the gateways 112(1)-(n) may be configured to communicate via the communication networks 110(1)-(n).

In addition, the CPMS 100 may include a cloud computing platform 114, one or more user devices 116(1)-(n), and one or more communication networks 118(1)-(n). The communication network(s) 118 may comprise any one or combination of multiple different types of networks, such as cellular networks, wireless networks, local area networks (LANs), wide area networks (WANs), personal area networks (PANs), the Internet, or any other type of network configured to communicate information between computing devices (e.g., the cloud computing platform 114, the user devices 116(1)-(N), and the gateway 112). Some examples of the user device 116 include smartphones and computing devices, Internet of Things (IoT) devices, video game systems, robots, process automation equipment, sensors, control devices, vehicles, transportation equipment, virtual and augmented reality (VR and AR) devices, industrial machines, etc.

Further, the cloud computing platform 114 may be configured to provide event messages 120(1)-(n) generated by the control system 102 to a CPMS client 122 of a user device 116 via the communication network 118. Consequently, a user of a user device 116 may be able to view of the state of the supervised premises via the CPMS client 122 based on the event messages 120(1)-(n) generated by the control panels 106(1)-(n). In some aspects, CPMS client 122 may be a mobile application, or a web application, and the CPMS client 122 may receive the event messages 120 of a control panel 106 in response to the CPMS client 122 subscribing to the control panel 106 via the cloud computing platform 114.

As illustrated in FIG. 1, the CPMS client 122 may include a spooler 124, a queue 126, a processor 128, and one or more timers 130. In some instances, the number of event messages 120 received at a user device 116 may be capable of significantly degrading the user experience of the CPMS client 122. As an example, the processing load required to process the event messages 120 may cause the CPMS client 122 to become unresponsive or appear to be unresponsive due to lack of user facing activity. In some aspects, a CPMS client 122 may receive a number of event messages 120 capable of degrading the user experience when the CPMS client 122 initially connects to the cloud computing platform 114, subscribes to the control panel 106, and receives backdated status information of the control panel 106 via load intensive amounts of event messages 120. In some other aspects, a CPMS client 122 may receive a number of event messages 120 capable of degrading the CPMS client 122 when a control panel 106 associated with the CPMS client 122 is reporting an emergency. Further, the degradation of the user experience of the CPMS client 122 may be exacerbated by the limited processing capabilities of the user device 116 (e.g., the user device 116 may be a mobile device).

In some aspects, the spooler 124 may be configured to implement an intelligent batching process that reduces the degradative effects of receipt of an excessive number of event messages within a short period of time. In particular, the spooler 124 establishes a balance between processing incoming event messages 120 and updating a view displayed within a graphical user interface (GUI) of the CPMS client 122 resulting from the processing of previously received event messages 120. Further, the balance established by the spooler 124 prevents the user facing features of the CPMS client 122 (e.g., the view rendered within a GUI of the CPMS client 122) from appearing unresponsive and/or failing to provide critical information corresponding to an emergency at the supervised premises.

As described in detail herein, the spooler 124 may be configured to add incoming event messages 120 to the queue 126, select a configurable amount (i.e., a minimum or maximum pool size) of event messages 120 from the queue 126 when the number of event messages 120 in the queue is greater than or equal to the configurable amount, and dispatch the selected event messages 120 to the processor 128 to be processed. In some aspects, the pool size (i.e., a dispatch threshold) may be dynamically configured based on monitoring device performance to minimize degradation of the user experience while maximizing the speed of updates to the status information of a control panel 106 based on the processing of the event messages 120.

In response to dispatching the event messages 120 selected from the queue 126, the spooler 124 may start a first timer 130(1) (i.e., a timer having duration of dispatch interval) and block processing of the remaining event messages 120 on the queue 126 while the first timer 130(1) is unexpired and/or the dispatched event messages 120 have not been processed. In some examples, processing an event message 120 may include filtering the event message 120, collating the event message 120 with other event messages 120, and updating a view of the CPMS client 122 based on the processing of the event message 120. Further, in some aspects, the spooler 124 may be configured to delay dispatching of one or more of the event messages 120 when the number of event messages 120 in the queue is less than a second pool size. Further, the spooler may delay dispatch of the one or more event messages 120 in accordance with a second timer 130(2) (i.e., a timer having duration of the delay interval). In some examples, once the second timer is expired, the spooler 124 may dispatch the one or more event messages 120 in the queue 126 even if the number of event messages 120 in the queue 126 is less than the second pool size (i.e., the minimum pool size). In some other examples, the spooler 124 may delay dispatching at least one more time in accordance with the second timer or a lesser amount of time to wait until the minimum pool size is stored in the queue 126. Further, in some aspects, the maximum pool size and minimum pool size are the same value.

Figure 2:
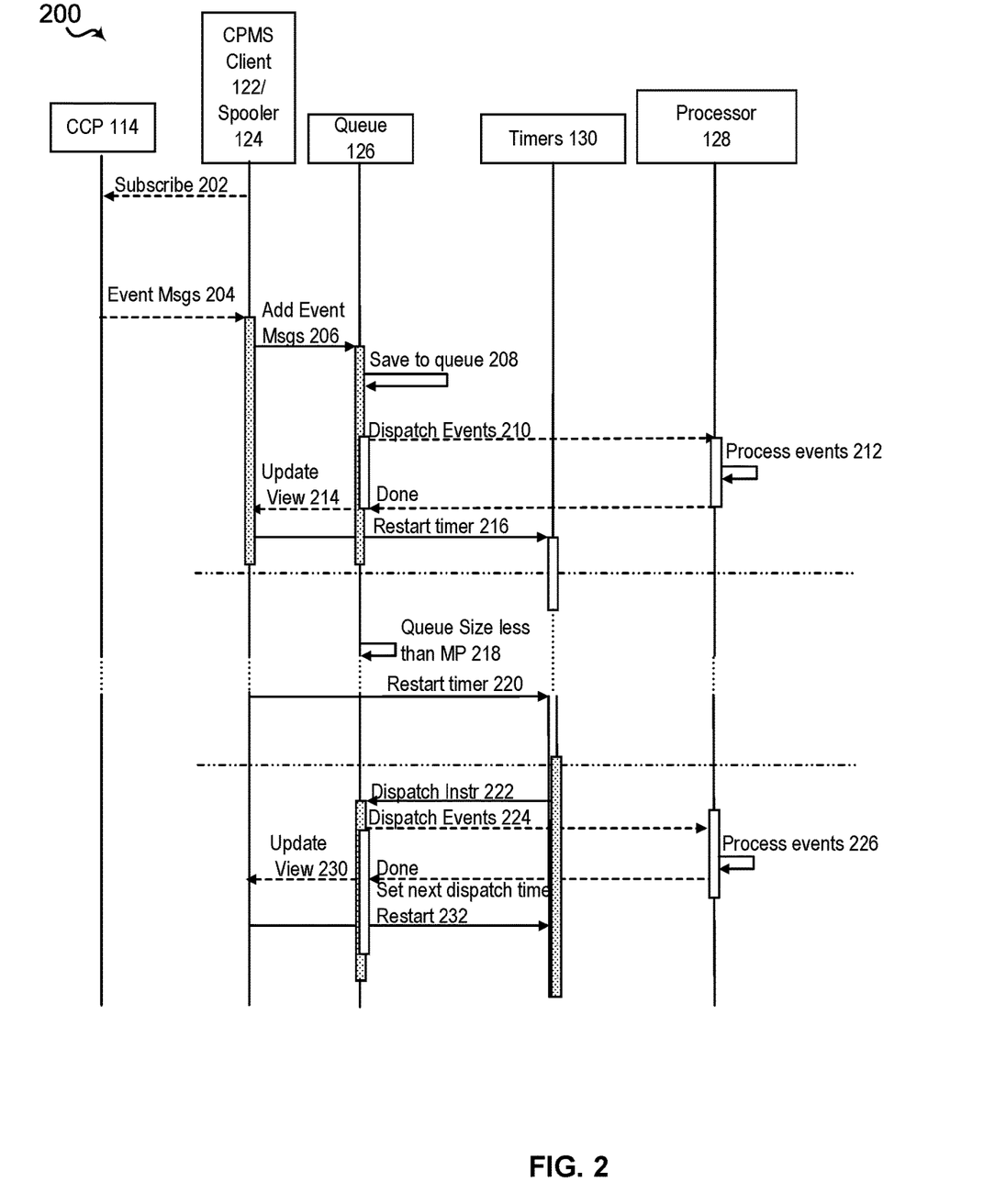
FIG. 2 is a flow diagram of an example of a method of processing excess event messages, according to some implementations.

FIG. 2 is a flow diagram of an example of a method 200 of processing excess event using a spooler of a mobile device, according to some implementations. As illustrated in FIG. 2, at step 202, a CPMS client 122 may subscribe to a control panel 106 via the cloud computing platform 114. Once the CPMS client 122 has subscribed to the control panel 106, at step 204, the CPMS client 122 may be configured to receive the event messages 120 from the cloud computing platform 114. In some aspects the number of event messages 120 received may be load intensive due to the status of control panel 106 or the CPMS client's lack of knowledge of the status of the control panel 106, (e.g., the CPMS client 122 may be awaiting receipt of a solicited message/current status information in an initialization process). At step 206, the spooler 124 may add the event messages 120 to the queue 126, and at step 208, the queue 126 may save the event messages 120 received from the spooler 124. At step 210, the spooler 124 may cause the queue 126 to dispatch a first batch of event messages 120 to the processor 128 for processing. In some aspects, the spooler 124 may instruct the queue 126 to dispatch the first batch in response to the number of event messages saved to the queue 126 being greater than a minimum pool size or equal to a maximum pool size, and a dispatch timer 130(1) being expired.

At step 212, the processor 128 may process the batch of event messages 120 dispatched from queue 126 while the spooler 124 blocks processing of any other event messages 120 in the queue 126. At step 214, the CPMS client 122 may update a view corresponding to the status of the control panel 106 based on the completed processing of the first batch of event messages 120, and display the view via a GUI of the CPMS client 122.

At step 216, in response to completion of processing of the first batch of event messages 120, the spooler 124 may dispatch a second batch of event messages 120 and restart the first timer 130(1) having a duration equal to dispatcher interval.

In some aspects, as described in detail herein, the number of event messages stored within the queue 126 may be less than a minimum pool size and the spooler 124 may perform a delay technique. For example, in response to the timer 130(1) expiring, at step 218, the spooler 124 may compare the number of event messages 120 stored in the queue 126 to the minimum pool value, and determine that the number of event messages 120 stored in the queue 126 is less than the minimum pool value. As a result, at step 220, the spooler 124 and/or the queue 126 may trigger the second timer 130(2) having a duration equal to the delay interval. Further, the delay may prevent the inefficient usage of processing resources for small batches of event messages 120.

At step 222, the spooler 124 may determine that the second timer 130(2) has expired 120 and that the number of event messages 120 stored in the queue 126 has increased and currently greater than the minimum pool size. Further, the spooler 124 and/or the timer 130 may instruct the queue 126 to transmit a third batch of event messages 120 to the processor 128 in response to the increase in the number of event messages 120 stored in the queue 126. At step 224, the queue 126 may dispatch the third batch of event messages 120 to the processor 128. At step 226, the processor 128 may process the third batch of event messages 120 while the spooler 124 blocks processing of any other event messages 120 in the queue 126. At step 230, the CPMS client 122 may update a view corresponding to the status of the control panel 106 based on the completed processing of the third batch of event messages 120, and display the view via a GUI of the CPMS client 122. At step 232, the spooler 124 may repeat the method 200 and restart the first timer 130(1) or the second timer 130(2) based on the state of the queue 126.

Figure 3:
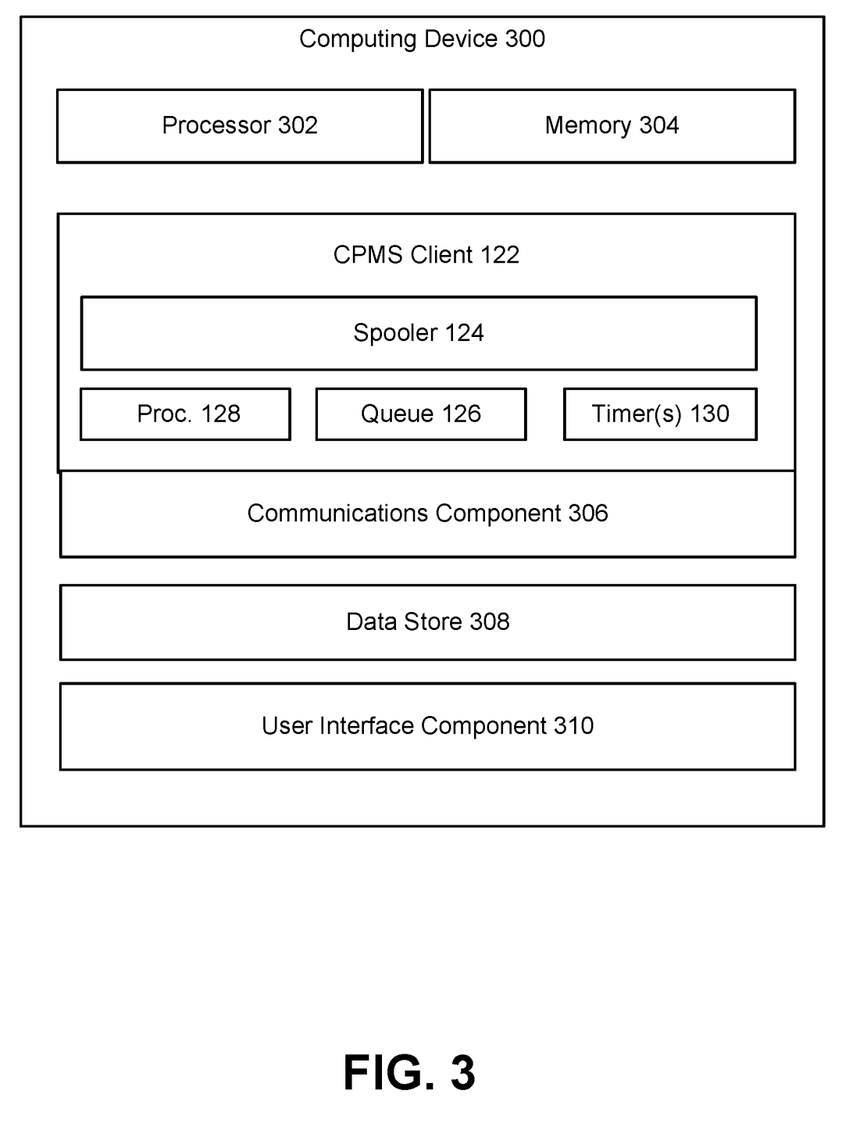
FIG. 3 is block diagram of an example of a computer device configured to process excess event messages using a mobile application, according to some implementations.

FIG. 3 is block diagram of an example of a computer device configured synchronize an event monitoring application with an event monitoring service, according to some implementations. Referring to FIG. 3, a computing device 300 may implement all or a portion of the functionality described herein. The computing device 300 may be or may include or may be configured to implement the functionality of at least a portion of the CPMS 100, or any component therein. For example, the computing device 300 may be or may include or may be configured to implement the functionality of the user device 116, the control panel 106, the cloud computing platform 114, or the control sensors 108(1)-(N). The computing device 300 includes a processor 302 which may be configured to execute or implement software, hardware, and/or firmware modules that perform any functionality described herein. For example, the processor 302 may be configured to execute or implement software, hardware, and/or firmware modules that perform any functionality described herein with reference to the CPMS client 122, or any other component/system/device described herein.

The processor 302 may be a micro-controller, an application-specific integrated circuit (ASIC), a digital signal processor (DSP), or a field-programmable gate array (FPGA), and/or may include a single or multiple set of processors or multi-core processors. Moreover, the processor 302 may be implemented as an integrated processing system and/or a distributed processing system. The computing device 300 may further include a memory 304, such as for storing local versions of applications being executed by the processor 302, related instructions, parameters, etc. The memory 304 may include a type of memory usable by a computer, such as random-access memory (RAM), read only memory (ROM), tapes, magnetic discs, optical discs, volatile memory, non-volatile memory, and any combination thereof. Additionally, the processor 302 and the memory 304 may include and execute an operating system executing on the processor 302, one or more applications, display drivers, etc., and/or other components of the computing device 300.

Further, the computing device 300 may include a communications component 306 that provides for establishing and maintaining communications with one or more other devices, parties, entities, etc. utilizing hardware, software, and services. The communications component 306 may carry communications between components on the computing device 300, as well as between the computing device 300 and external devices, such as devices located across a communications network and/or devices serially or locally connected to the computing device 300. In an aspect, for example, the communications component 306 may include one or more buses, and may further include transmit chain components and receive chain components associated with a wireless or wired transmitter and receiver, respectively, operable for interfacing with external devices.

Additionally, the computing device 300 may include a data store 308, which can be any suitable combination of hardware and/or software, that provides for mass storage of information, databases, and programs. For example, the data store 308 may be or may include a data repository for applications and/or related parameters not currently being executed by processor 302. In addition, the data store 308 may be a data repository for an operating system, application, display driver, etc., executing on the processor 302, and/or one or more other components of the computing device 300.

The computing device 300 may also include a user interface component 310 operable to receive inputs from a user of the computing device 300 and further operable to generate outputs for presentation to the user (e.g., via a display interface to a display device). The user interface component 310 may include one or more input devices, including but not limited to a keyboard, a number pad, a mouse, a touch-sensitive display, a navigation key, a function key, a microphone, a voice recognition component, or any other mechanism capable of receiving an input from a user, or any combination thereof. Further, the user interface component 310 may include one or more output devices, including but not limited to a display interface, a speaker, a haptic feedback mechanism, a printer, any other mechanism capable of presenting an output to a user, or any combination thereof.

Figure 4:
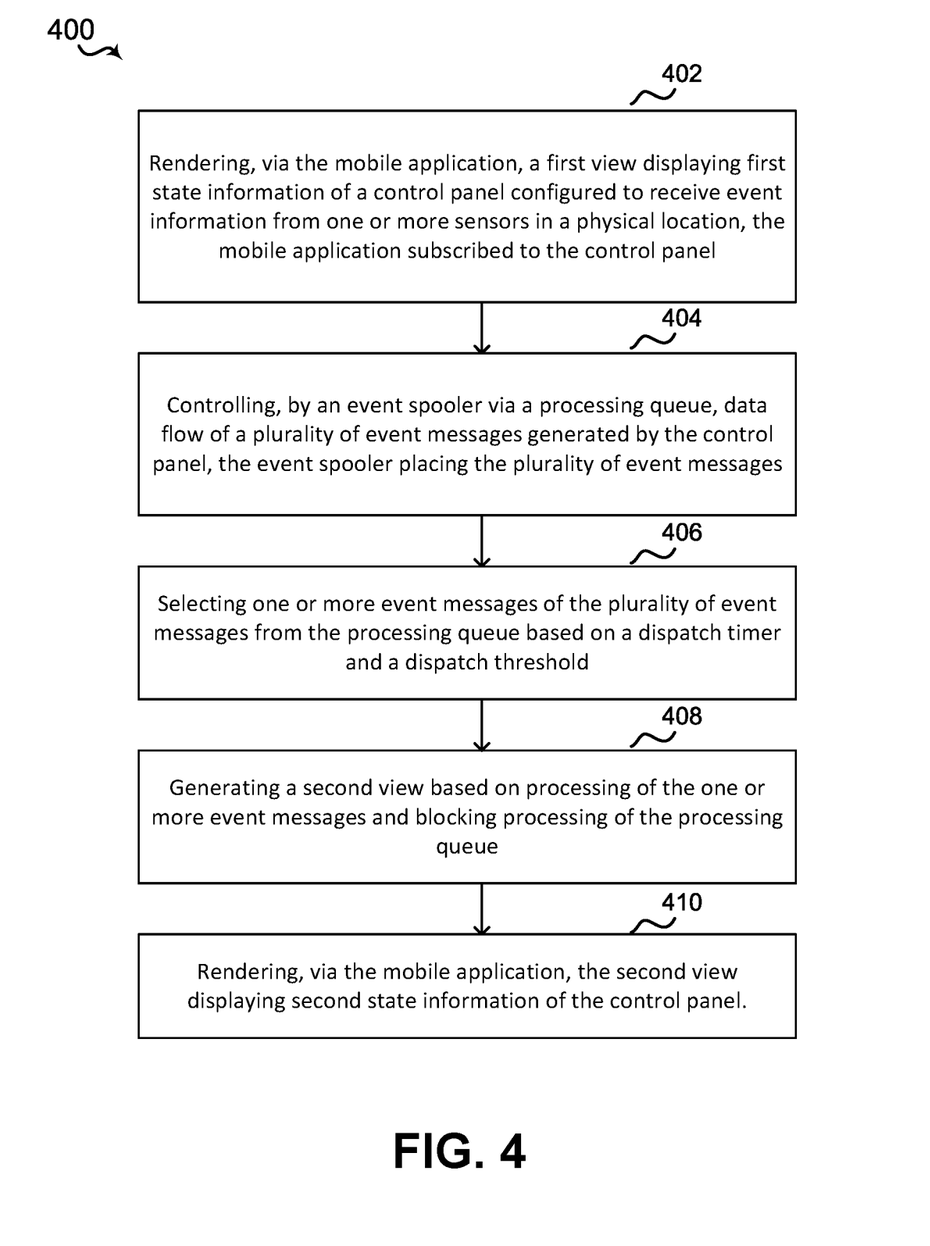
FIG. 4 is a flow diagram of an example of a method of processing excess event messages using a mobile application, according to some implementations.

Referring to FIG. 3 and FIG. 4, in operation, computing device 300 may perform a method 400 of wireless communication, by such as via execution of CPMS client 122 by processor 302 and/or memory 304.

At block 402, the method 400 includes rendering, via the mobile application, a first view displaying first state information of a control panel configured to receive event information from one or more sensors in a physical location, the mobile application subscribed to the control panel. For example, in an aspect, the computing device 300, the processor 302, the memory 304, and the CPMS client 122 may be configured to or may comprise means for rendering, via the mobile application, a first view displaying first state information of a control panel configured to receive event information from one or more sensors in a physical location, the mobile application subscribed to the control panel. For example, the rendering at block 402 may include the CPMS client 122 subscribing to a control panel 106(1) via the cloud computing platform 114, receiving event messages 120 based on the subscription, determining a view based on the event messages 120, and rendering the view via a GUI of the CPMS client 122.

At block 404, the method 400 includes controlling, by an event spooler via a processing queue, data flow of a plurality of event messages generated by the control panel. For example, in an aspect, the computing device 300, the processor 302, the memory 304, the CPMS client 122, the spooler 124, and/or the queue 126 may be configured to or may comprise means for controlling, by an event spooler via a processing queue, data flow of a plurality of event messages generated by the control panel. For example, the controlling at block 404 may include the spooler 124 adding the event messages 120 to the queue 126 and controlling dispatching of the event messages 120 from the queue 126 to the processor 128. Further, for example, the controlling at block 404 may be performed to establish a balance between processing incoming event messages 120 and updating a view displayed within a GUI of the CPMS client 122 resulting from the processing of previously received event messages 120.

At block 406, the method 400 includes selecting one or more event messages of the plurality of event messages from the processing queue based on a dispatch timer and a dispatch threshold. For example, in an aspect, the computing device 300, the processor 302, the memory 304, the CPMS client 122, spooler 124 and/or the queue 126 may be configured to or may comprise means for selecting one or more event messages of the plurality of event messages from the processing queue based on a dispatch timer and a dispatch threshold. For example, the selecting at block 406 may include the spooler 124 selecting a first batch of event messages 120 from the queue 126 based on a first timer 130(1) and the number of event messages 120 within the first batch being equal to or greater than a pool size (e.g., maximum pool size or the minimum pool size). Further, for example, the selecting at block 406 may be performed to establish a balance between processing incoming event messages 120 and updating a view displayed within a graphical user interface (GUI) of the CPMS client 122 resulting from the processing of previously received event messages 120.

At block 408, the method 400 includes generating a second view based on processing of the one or more event messages and blocking processing of the processing queue. For example, in an aspect, the computing device 300, the processor 302, the memory 304, the CPMS client 122, the processor 128 and/or the spooler 124 may be configured to or may comprise means for generating a second view based on processing of the one or more event messages and blocking processing of the processing queue.

For example, the generating at block 408 may include the processor 128 processing the batch of event messages 120 dispatched from queue 126 while the spooler 124 blocks processing of any other event messages 120 in the queue 126. Further, the CPMS client 122 may update a view corresponding to the status of the control panel 106 based on the completed processing of the first batch of event messages 120, and display the view via a GUI of the CPMS client 122. Further, for example, the generating at block 408 may be performed to establish a balance between processing incoming event messages 120 and updating a view displayed within a graphical user interface (GUI) of the CPMS client 122 resulting from the processing of previously received event messages 120.

At block 410, the method 400 includes rendering, via the mobile application, the second view displaying second state information of the control panel. For example, in an aspect, the computing device 300, the processor 302, the memory 304, and/or the CPMS client 122 may be configured to or may comprise means for rendering, via the mobile application, the second view displaying second state information of the control panel. For example, the rendering at block 410 may include the CPMS client 122 rendering a second view generated from updates to the first view based on the first batch of event messages 120.

Figure 5:
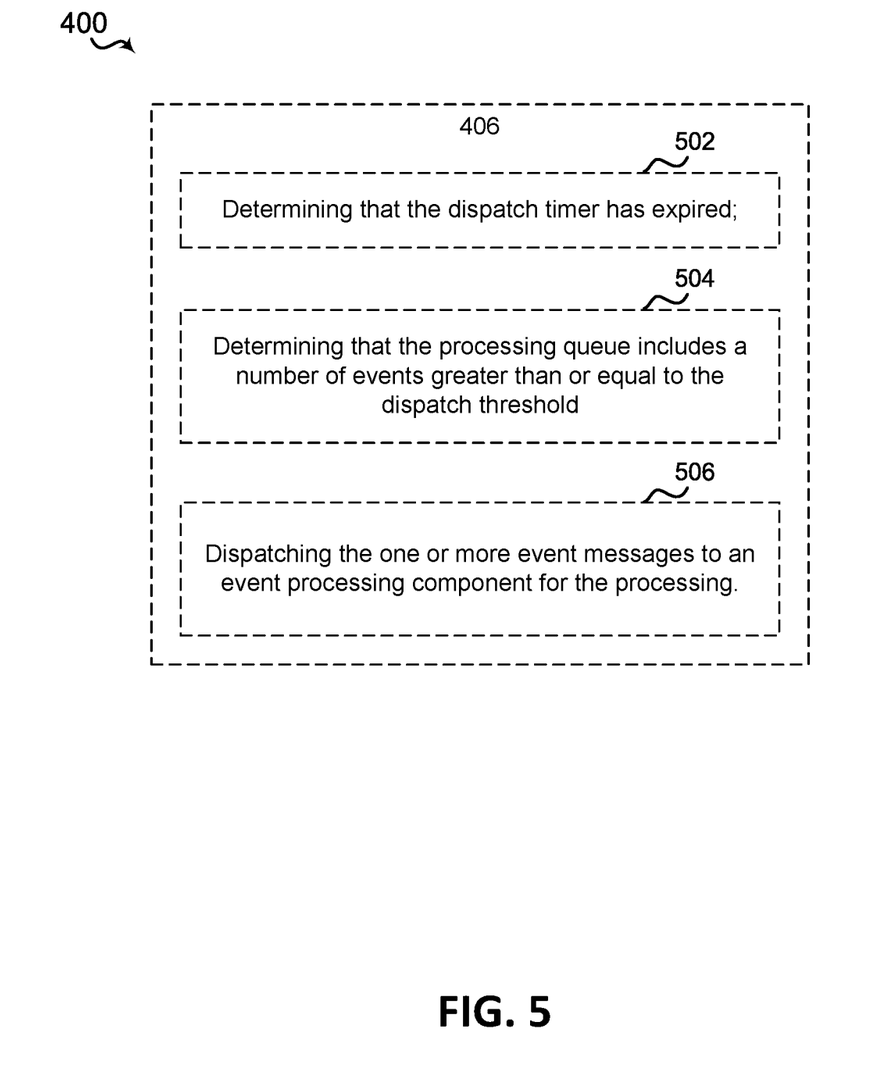
FIG. 5 is a flow diagram of an example of a method of triggering event message processing using a mobile application, according to some implementations.

Referring to FIG. 5, in an alternative or additional aspect, at block 502, the selecting at block 406 of the one or more event messages of the plurality of event messages from the processing queue further includes determining that the dispatch timer has expired. For example, the spooler 124 may determine that the first timer 130(1) is expired and the number of event messages within the queue 126 is greater than a minimum pool size or equal to a maximum pool size. In some aspects, the minimum pool size and the maximum pool size may be equal. In this optional aspect, at block 504, the selecting at block 406 of the one or more event messages of the plurality of event messages from the processing queue further includes determining that the processing queue includes a number of events greater than or equal to the dispatch threshold. For example, the spooler 124 may select the first batch of message events 120 based on the first timer 130(1) being expired and the number of event messages 120 being greater than a minimum pool size or equal to a maximum pool size. In this optional aspect, at block 506, the selecting at block 406 of the one or more event messages of the plurality of event messages from the processing queue further includes dispatching the one or more event messages to an event processing component for the processing. For example, the spooler 124 may cause the queue 126 to dispatch the first batch of event messages 120 to the processor 128.

Figure 6:
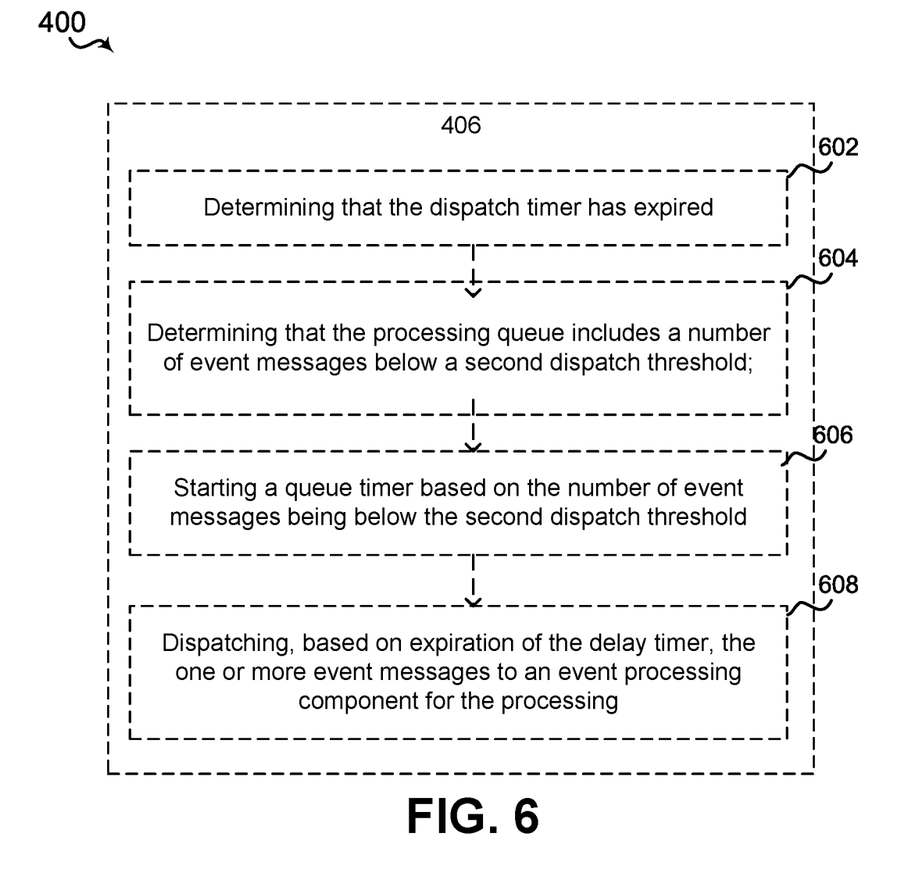
FIG. 6 is a flow diagram of an example of a method of delaying triggering of event message processing using a mobile application, according to some implementations.

Referring to FIG. 6, in an alternative or additional aspect wherein the dispatch threshold is a first dispatch threshold, at block 602, the selecting at block 406 of the one or more event messages of the plurality of event messages from the processing queue further includes determining that the dispatch timer has expired. For example, the spooler 124 may determine that the first timer 130(1) is expired. In this optional aspect, at block 604, the selecting at block 406 of the one or more event messages of the plurality of event messages from the processing queue further includes determining that the processing queue includes a number of event messages below a second dispatch threshold. For example, the spooler 124 may determine that the number of event messages 120 within the queue 126 is less than a minimum pool size. In this optional aspect, at block 606, the selecting at block 406 of the one or more event messages of the plurality of event messages from the processing queue further includes starting a delay timer based on the number of event messages being below the second dispatch threshold. For example, the spooler 124 may start the second timer 130(2) corresponding to the delay interval in response to the. In this optional aspect, at block 608, the selecting at block 406 of the one or more event messages of the plurality of event messages from the processing queue further includes dispatching, based on expiration of the delay timer, the one or more event messages to an event processing component for the processing. For example, the spooler 124 may select a first batch of message events 120 from the queue 126 based on the second timer 130(1) being expired and dispatch the first batch of event messages 120 to the processor 128.

In an alternative or additional aspect, the plurality of event messages correspond to an emergency detected by the control panel.

Figure 7:
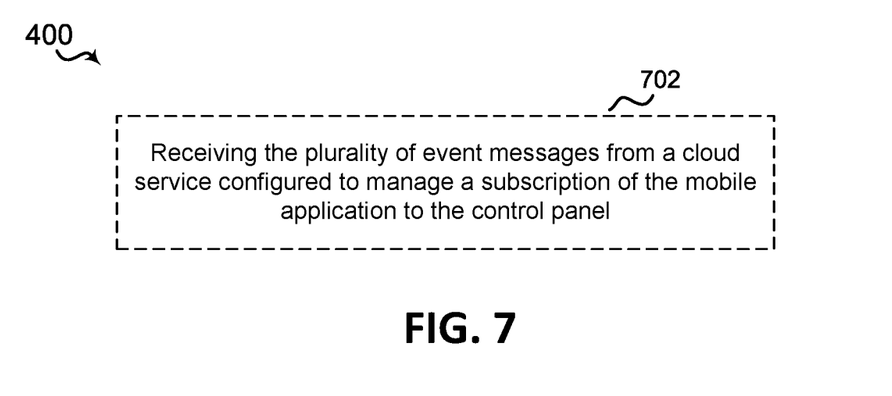
FIG. 7 is a flow diagram of an example of a method of receiving event messages based on a cloud service subscription, according to some implementations.

Referring to FIG. 7, in an alternative or additional aspect at block 702, the method 400 may further include receiving the plurality of event messages from a cloud service configured to manage a subscription of the mobile application to the control panel. For example, in an aspect, the computing device 300, the processor 302, the memory 304, the CPMS client 122, and/or the queue 126 may be configured to or may comprise means for receiving the plurality of event messages from a cloud service configured to manage a subscription of the mobile application to the control panel. For example, the receiving at block 702 may include the CPMS client 122 subscribing to a control panel 106(1) via the cloud computing platform 114, and receiving the event messages 120 based on the subscription.

In an alternative or additional aspect, the plurality of event messages correspond to a current state of the control panel determined by a cloud service during a synchronization process between the mobile application and the cloud service, and wherein the cloud service is configured to manage a subscription of the mobile application to the control panel.

In an alternative or additional aspect, the processing includes filtering or collating the one or more event messages.

In an alternative or additional aspect, the processing includes adding the one or more event messages to the second view.

In an alternative or additional aspect, the one or more event messages are one or more first event messages, and the method may further include monitoring performance of mobile application, dynamically reconfiguring the dispatch timer and the dispatch threshold based on the monitoring, selecting, after the reconfiguring, one or more second event messages of the plurality of event messages from the processing queue based on the dispatch timer and the dispatch threshold, generating a third view based on processing of the one or more second event messages and blocking processing of the processing queue, and rendering, via the mobile application, the third view displaying third state information of the control panel.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method for processing excess event messages using a mobile application, comprising:
   rendering, via the mobile application, a first view displaying first state information of a control panel configured to receive event information from one or more sensors in a physical location, the mobile application subscribed to the control panel;
   controlling, by an event spooler via a processing queue, data flow of a plurality of event messages generated by the control panel;
   selecting one or more event messages of the plurality of event messages from the processing queue by determining that a dispatch timer has expired, determining that the processing queue includes a number of event messages below a dispatch threshold, starting a delay timer based on the number of event messages being below the dispatch threshold, and dispatching, based on expiration of the delay timer, the one or more event messages to an event processing component for processing;
   generating a second view based on the processing of the one or more event messages and blocking processing of other event messages in the processing queue; and
   rendering, via the mobile application, the second view displaying second state information of the control panel.

2. The method of claim 1, wherein the dispatch threshold is a first dispatch threshold, and wherein selecting the one or more event messages of the plurality of event messages from the processing queue further comprises:
   determining that the number of event messages in the processing queue is greater than or equal to a second dispatch threshold; and
   dispatching the one or more event messages to the event processing component for the processing based on the number of event messages in the processing queue being greater than or equal to the second dispatch threshold.

3. The method of claim 2, wherein the second dispatch threshold is a same threshold as the first dispatch threshold.

4. The method of claim 1, wherein the plurality of event messages correspond to an emergency detected by the control panel.

5. The method of claim 1, further comprising:
   receiving the plurality of event messages from a cloud service configured to manage a subscription of the mobile application to the control panel.

6. The method of claim 1, wherein the plurality of event messages correspond to a current state of the control panel determined by a cloud service during a synchronization process between the mobile application and the cloud service, and wherein the cloud service is configured to manage a subscription of the mobile application to the control panel.

7. The method of claim 1, wherein the processing includes filtering or collating the one or more event messages.

8. The method of claim 1, wherein the processing includes adding the one or more event messages to the second view.

9. The method of claim 1, wherein the one or more event messages are one or more first event messages, further comprising:
   monitoring performance of the mobile application;
   dynamically reconfiguring the dispatch timer and the dispatch threshold based on the monitoring;
   selecting, after the reconfiguring, one or more second event messages of the plurality of event messages from the processing queue based on the dispatch timer and the dispatch threshold;
   generating a third view based on processing of the one or more second event messages and blocking processing of the processing queue; and
   rendering, via the mobile application, the third view displaying third state information of the control panel.

10. An apparatus for processing excess event messages using a mobile application, comprising:
    a memory; and
    a processor communicatively coupled with the memory and configured to:
      render, via the mobile application, a first view displaying first state information of a control panel configured to receive event information from one or more sensors in a physical location, the mobile application subscribed to the control panel;
      control, by an event spooler via a processing queue, data flow of a plurality of event messages generated by the control panel;
      select one or more event messages of the plurality of event messages from the processing queue by determining that a dispatch timer has expired, determining that the processing queue includes a number of event messages below a dispatch threshold, starting a delay timer based on the number of event messages being below the dispatch threshold, and dispatching, based on expiration of the delay timer, the one or more event messages to an event processing component for processing;
      generate a second view based on the processing of the one or more event messages and blocking processing of other event messages in the processing queue; and
      render, via the mobile application, the second view displaying second state information of the control panel.

11. The apparatus of claim 10, wherein the dispatch threshold is a first dispatch threshold, and wherein to select the one or more event messages of the plurality of event messages from the processing queue the processor is further configured to:
    determine that the number of event messages in the processing queue is greater than or equal to a second dispatch threshold; and
    dispatch the one or more event messages to the event processing component for the processing based on the number of event messages in the processing queue being greater than or equal to the second dispatch threshold.

12. The apparatus of claim 11, wherein the second dispatch threshold is a same threshold as the first dispatch threshold.

13. The apparatus of claim 10, wherein the plurality of event messages correspond to an emergency detected by the control panel.

14. The apparatus of claim 10, wherein the processor is further configured to:

receive the plurality of event messages from a cloud service configured to manage a subscription of the mobile application to the control panel.

15. The apparatus of claim 10, wherein the plurality of event messages correspond to a current state of the control panel determined by a cloud service during a synchronization process between the mobile application and the cloud service, and wherein the cloud service is configured to manage a subscription of the mobile application to the control panel.

16. The apparatus of claim 10, wherein the processing includes filtering or collating the one or more event messages.

17. The apparatus of claim 10, wherein the processing includes adding the one or more event messages to the second view.

18. The apparatus of claim 10, wherein the one or more event messages are one or more first event messages, wherein the processor is further configured to:
  monitor performance of the mobile application;
  dynamically reconfiguring the dispatch timer and the dispatch threshold based on the monitoring;
  select, after the reconfiguring, one or more second event messages of the plurality of event messages from the processing queue based on the dispatch timer and the dispatch threshold;
  generate a third view based on processing of the one or more second event messages and blocking processing of the processing queue; and
  render, via the mobile application, the third view displaying third state information of the control panel.

19. A non-transitory computer-readable medium storing instructions for processing excess event messages using a mobile application, wherein the instructions are executable by a processor to:
  render, via the mobile application, a first view displaying first state information of a control panel configured to receive event information from one or more sensors in a physical location, the mobile application subscribed to the control panel;
  control, by an event spooler via a processing queue, data flow of a plurality of event messages generated by the control panel;
  select one or more event messages of the plurality of event messages from the processing queue by determining that a dispatch timer has expired, determining that the processing queue includes a number of event messages below a dispatch threshold, starting a delay timer based on the number of event messages being below the dispatch threshold, and dispatching, based on expiration of the delay timer, the one or more event messages to an event processing component for processing;
  generate a second view based on the processing of the one or more event messages and blocking processing of other event messages in the processing queue; and
  render, via the mobile application, the second view displaying second state information of the control panel.

20. The non-transitory computer-readable medium of claim 19, wherein the dispatch threshold is a first dispatch threshold, and wherein selecting the one or more event messages of the plurality of event messages from the processing queue further comprises:
  determining that the number of event messages in the processing queue is greater than or equal to the a second dispatch threshold; and
  dispatching the one or more event messages to the event processing component for the processing based on the number of event messages in the processing queue being greater than or equal to the second dispatch threshold.

21. The non-transitory computer-readable medium of claim 20, wherein the second dispatch threshold is a same threshold as the first dispatch threshold.

* * * * *